(12) United States Patent
Hiwada

(10) Patent No.: US 7,935,894 B2
(45) Date of Patent: May 3, 2011

(54) FLEXIBLE WIRING CABLE

(75) Inventor: Shuhei Hiwada, Toyoake (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 479 days.

(21) Appl. No.: 12/034,492

(22) Filed: Feb. 20, 2008

(65) Prior Publication Data

US 2008/0202796 A1    Aug. 28, 2008

(30) Foreign Application Priority Data

Feb. 22, 2007    (JP) .................................. 2007-042617

(51) Int. Cl.
*H05K 1/11*    (2006.01)
(52) U.S. Cl. ........ 174/261; 174/254; 174/250; 174/260; 174/262; 361/777
(58) Field of Classification Search .................. 174/254, 174/250, 251, 253, 255, 260–266, 268; 361/760, 361/765, 767, 768, 750, 751, 777, 778
See application file for complete search history.

(56) References Cited

U.S. PATENT DOCUMENTS

| 4,246,595 | A | * | 1/1981 | Noyori et al. ................. 257/668 |
| 5,717,556 | A | * | 2/1998 | Yanagida ....................... 361/803 |
| 6,841,739 | B2 | * | 1/2005 | Moore .......................... 174/255 |
| 6,862,184 | B2 | * | 3/2005 | Shi et al. ....................... 361/719 |
| 2005/0253488 | A1 | | 11/2005 | Ito | |

FOREIGN PATENT DOCUMENTS

| JP | 2005-322850 A | 11/2005 |
| JP | 2007-007955 A | 1/2007 |

* cited by examiner

*Primary Examiner* — Dameon E Levi
*Assistant Examiner* — Hoa C Nguyen
(74) *Attorney, Agent, or Firm* — Baker Botts L.L.P.

(57) ABSTRACT

A flexible wiring cable includes a flexible flat base, and a plurality of first and second leads wired on first and second surfaces of the base respectively. First and second circuit elements are mounted on the first and second leads respectively. A plurality of terminal electrodes is provided on the first surface of the base. The terminal electrodes include a plurality of first terminal electrodes formed on the first leads and a plurality of second terminal electrodes formed on the second leads, being exposed to the outside of the first surface side via through holes formed in the base.

6 Claims, 8 Drawing Sheets

F I G. 2
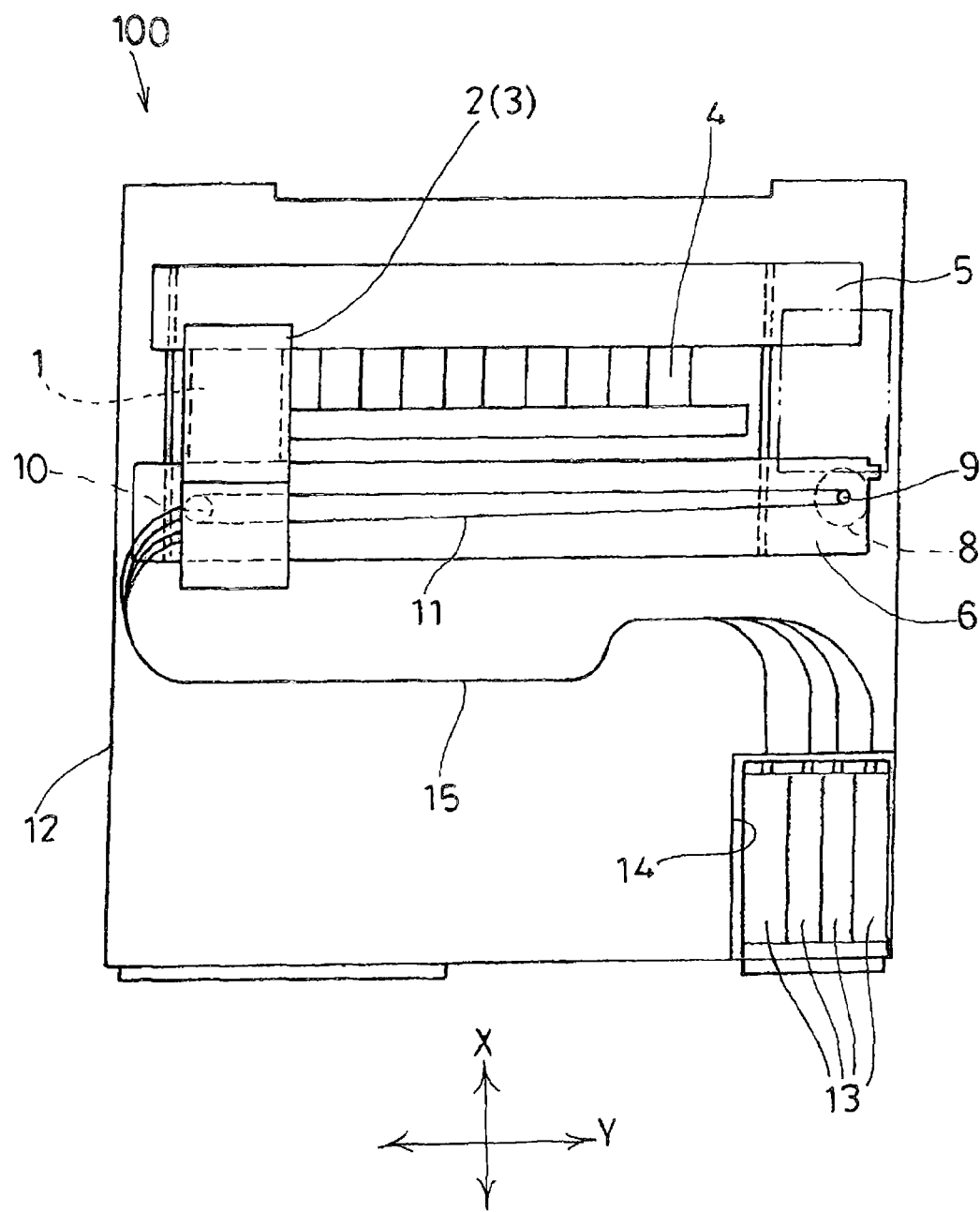

F I G. 4
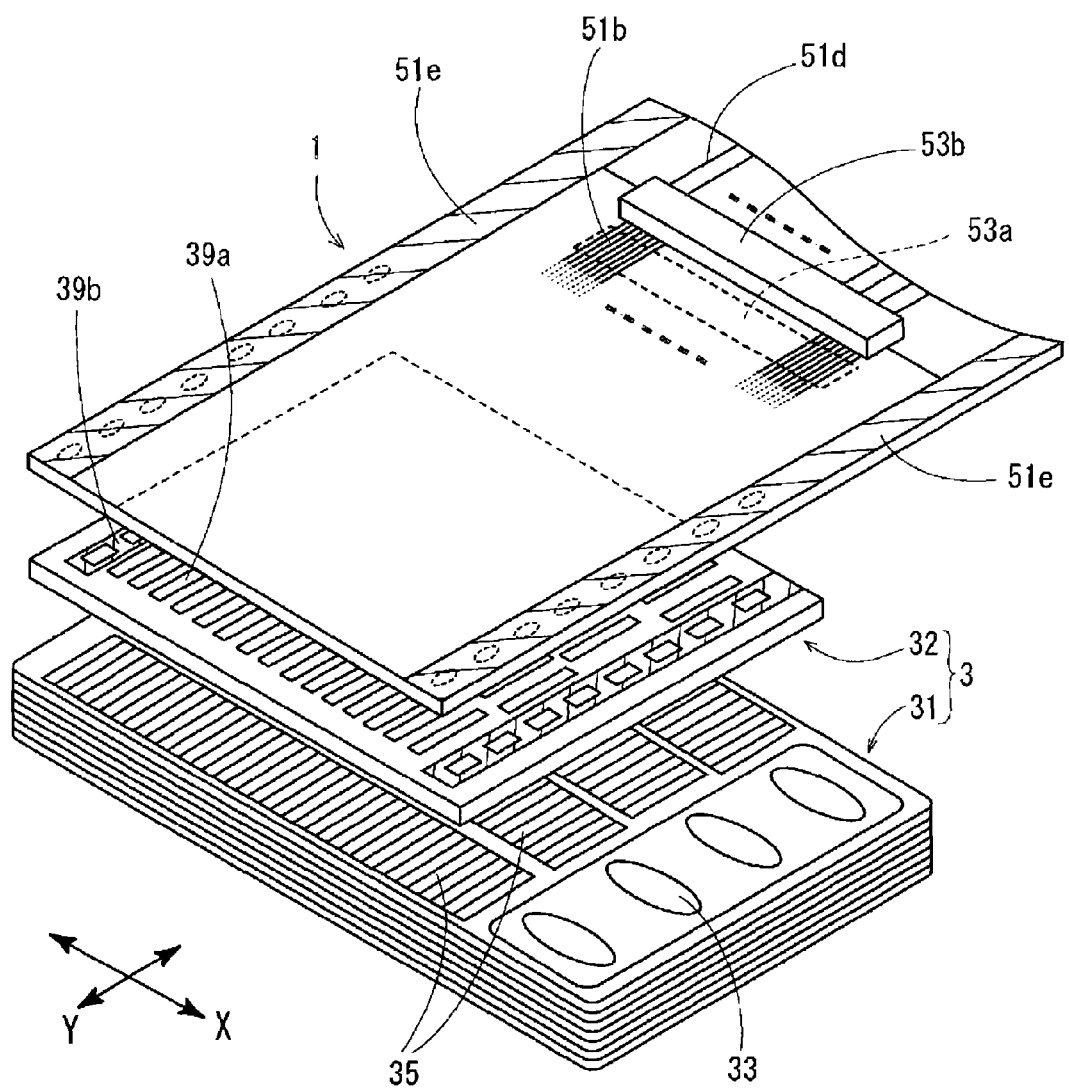

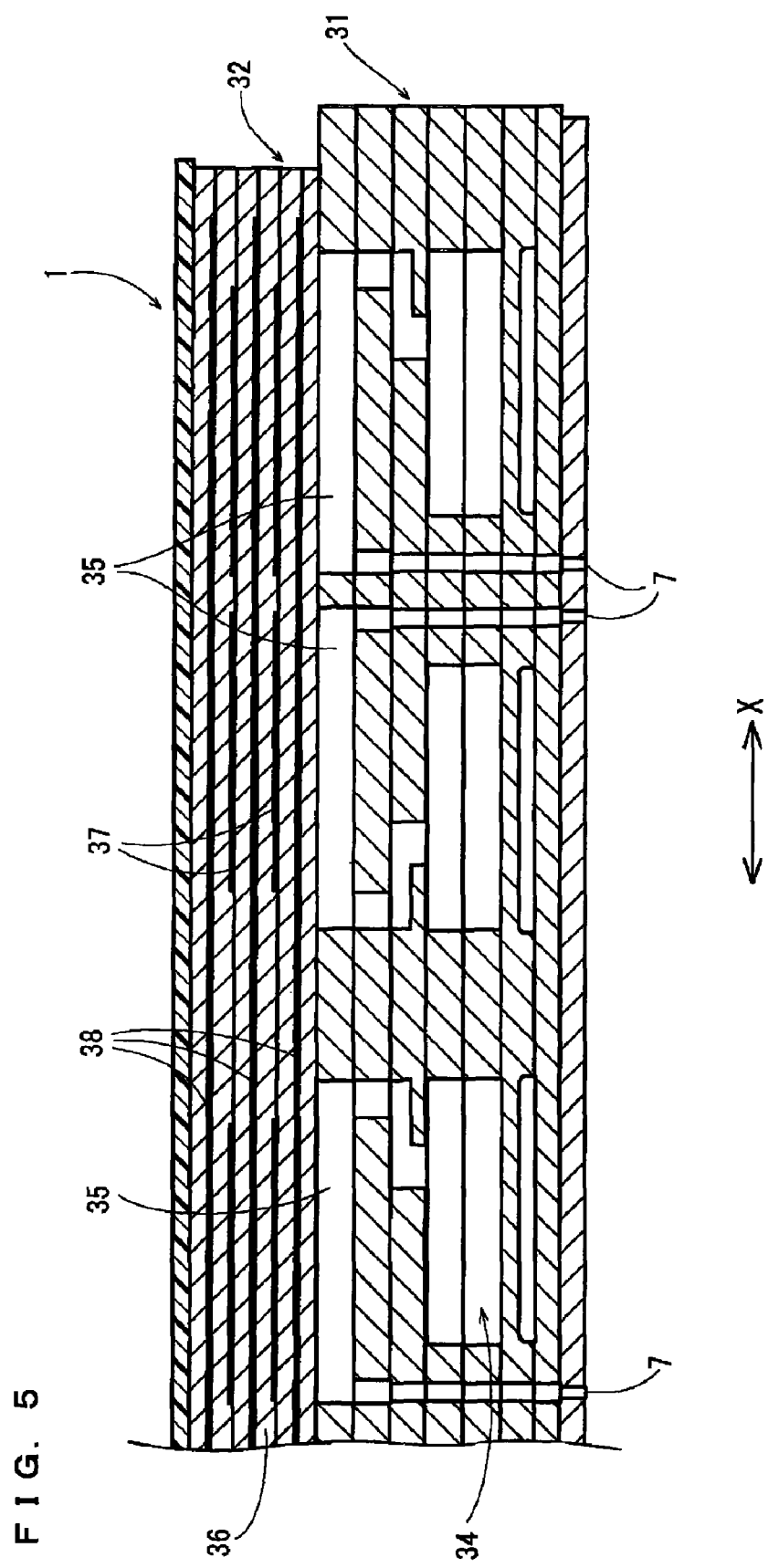

FLEXIBLE WIRING CABLE

CROSS-REFFERENCE TO RELATED APPLICATION

This Nonprovisional application claims priority under 35 U.S.C. §119(a) on Patent Application No. 2007-42617 filed in Japan on Feb. 22, 2007, the entire contents of which are hereby incorporated by reference.

BACKGROUND

The present invention relates to a flexible wiring cable on which a circuit element is mounted.

As the flexible wiring cable mounted with the circuit element, a wiring cable or the like for transmitting a drive signal based on print data to an actuator of a recording head discharging ink is known, for example. As for the recording head, a structure including a cavity part having many nozzles and an ink supply path, and an actuator having an active part corresponding to each nozzle is disclosed in Japanese Patent Application Laid-Open No. 2007-7955, for example. Thus, the actuator and an external signal source are connected by the flexible wiring cable mounted with the circuit element.

The drive signal is supplied from the external signal source to each of the many active parts of the actuator through a circuit element of the flexible wiring cable, and each active part is changed independently. Thus, when the active part is changed, a discharging pressure is applied to the ink in the cavity part, so that ink is discharged selectively from each nozzle.

Meanwhile, according to a recent recording head, the number of nozzles discharging the ink tends to be increased and the number of active parts of the actuator tends to be increased as a recording density and a recording speed become high. Therefore, the number of leads wired in the flexible wiring cable is increased, so that many drive signals are processed by the circuit element. As a result, the circuit element increased in size and complicated is mounted on the flexible wiring cable.

FIGS. 1A and 1B are plan views showing conventional flexible wiring cables. According to a conventional example shown in FIG. 1A, an output terminal electrode 42 (a terminal electrode for outputting) connected to a surface electrode (not shown) of an actuator 32 is formed at one end of a flexible wiring cable 101, an input terminal electrode 41 (a terminal electrode for inputting) connected to an external signal source is formed at the other end, and a plurality of (two) circuit elements 53 are provided at the center.

According to a conventional example shown in FIG. 1B, an output terminal electrode 42 is formed at the center of the flexible wiring cable 101, an input terminal electrode 41 is formed at both ends respectively, and a circuit element 53 is provided between the output terminal electrode 42 and the input terminal electrode 41.

SUMMARY

When a large circuit element is mounted, or when a plurality of circuit elements are adjacently mounted on the same surface of the flexible wiring cable as shown in FIG. 1A, since the area of the flexible wiring cable itself becomes large, a device becomes large as a whole.

In addition, as shown in FIG. 1B, when the flexible wiring cable is pulled out in two directions away from the actuator and the circuit element is mounted on a pulled-out part respectively, the flexible wiring cable becomes large also and the structure for connecting it to the external signal source becomes complicated, which is a problem.

An object is to provide a compactly-constituted flexible wiring cable on which a circuit element is mounted even when the number of the mounted circuit elements is increased.

A flexible wiring cable of a first aspect has a flexible flat base; a plurality of first leads wired on a first surface of the base; a first circuit element mounted on the first leads on the first surface; a plurality of second leads wired on a second surface which is the other side of the base; a second circuit element mounted on the second leads on the second surface; and a plurality of terminal electrodes provided on the first surface of the base; wherein the plurality of terminal electrodes comprise a plurality of first terminal electrodes formed on and electrically connected to the first leads, and a plurality of second terminal electrodes formed on and electrically connected to the second leads, being exposed to the first surface via through holes formed in the base.

According to the flexible wiring cable of the first aspect, since the first and second leads are wired on the first and second surfaces (the front and back surfaces) of the base, and the first and second circuit elements are mounted on the first and second leads on the first and second surfaces (the front and back surfaces), that is, since the two surfaces of the flexible wiring cable are used, the area of the flexible wiring cable is doubled substantially, and the whole can be compactly constituted. Thus, even when the number of the leads is doubled, the same wiring pitch as the conventional example can be maintained without narrowing the width of the leads, so that troubles such as breakdown of the leads and short-circuit can be prevented from occurring. In addition, according to the terminal electrodes, since the first leads on the first surface of the base are partially exposed and the second leads are exposed to the first surface collectively, connection can be easily made by putting the first surface of the flexible wiring cable on an output load.

According to the flexible wiring cable of a second aspect, as set forth in the first aspect, the first circuit element and the second circuit element are arranged on the base so as not to overlap with each other in plan view. Thus, when one circuit element is mounted on the corresponding leads, it does not interfere with the other circuit element, so that it can be easily mounted.

According to the flexible wiring cable of a third aspect, as set forth in the first or second aspect, in regions mounted with the first and second circuit elements in the base, the first and second leads are partially exposed to the outside, bumps made of conductive material are arranged on them, and the first and second circuit elements are connected to the first and second leads respectively through the bumps, and the first and second leads are wired on the base so that a thickness of the flexible wiring cable at the positions arranged with the bumps is uniform. Thus, when the circuit element and the leads are connected at a plurality of positions, a pressure is uniformly applied to the plurality of positions, so that a connection defect of the bump can be prevented.

According to the flexible wiring cable of a fourth aspect, as set forth in the third aspect, a part having no bump on the first and second leads is wired at an opposite position of the base having the bumps. Thus, when one circuit element and the leads are connected at a plurality of positions, it can be easily mounted without interfering with the other circuit element.

According to the flexible wiring cable of a fifth aspect, as set forth in any one of the first to fourth aspects, the through hole is tapered in such a manner that an opening on the first surface side of the base is larger than an opening on the second surface side thereof, and the second terminal electrodes are formed by conductive material supplied to the through holes so that one end is connected to the second leads on the second surface and the other end is exposed to the first surface. Thus, the second terminal electrodes can be easily formed.

According to the flexible wiring cable of a sixth aspect, as set forth in any one of the first to fifth aspects, the first and second terminal electrodes are connected to an actuator of a recording head performing a recording operation by selective drive of the actuator. Thus, even when the number of nozzles of the recording head is increased and the number of the leads and the number of the circuit elements are increased, the area of the flexible wiring cable itself is not increased and the device does not become large as a whole.

The above and further objects and features of the invention will more fully be apparent from the following detailed description with accompanying drawings.

BRIEF DESCRIPTION OF THE SEVERAL VIEW OF THE DRAWINGS

FIG. 2 is a schematic plan view showing a recording device including a flexible wiring cable;

FIG. 4 is a perspective view showing a recording head and the flexible wiring cable;

FIG. 5 is a longitudinal sectional view showing the recording head taken along X direction;

DETAILED DESCRIPTION OF THE EXEMPLARY EMBODIMENTS

Figure 1A:
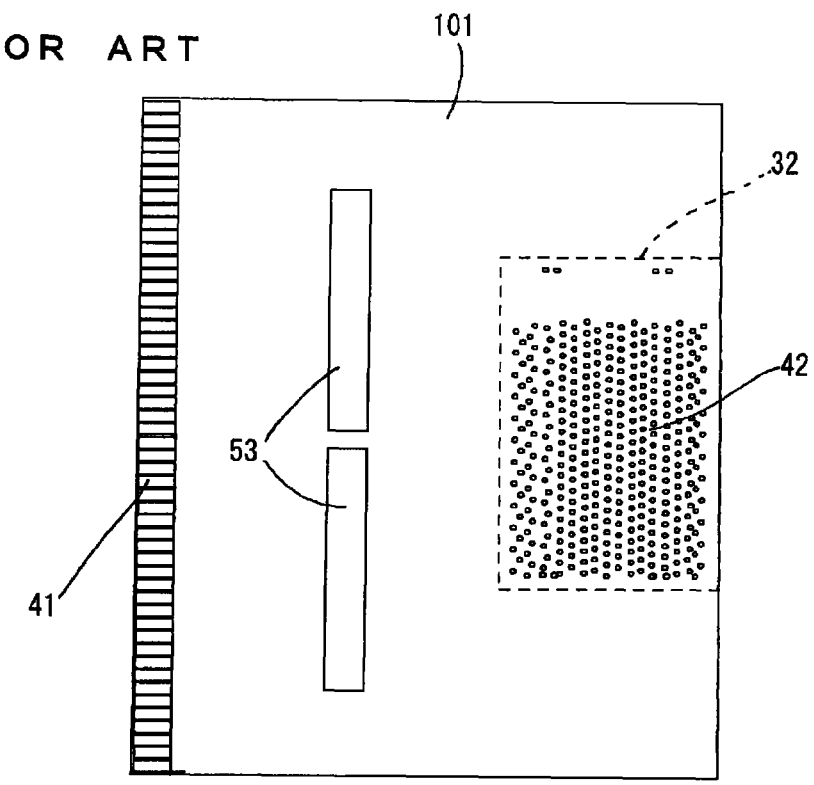
FIGS. 1A and 1B are plan views showing conventional flexible wiring cables.
Figure 1B:
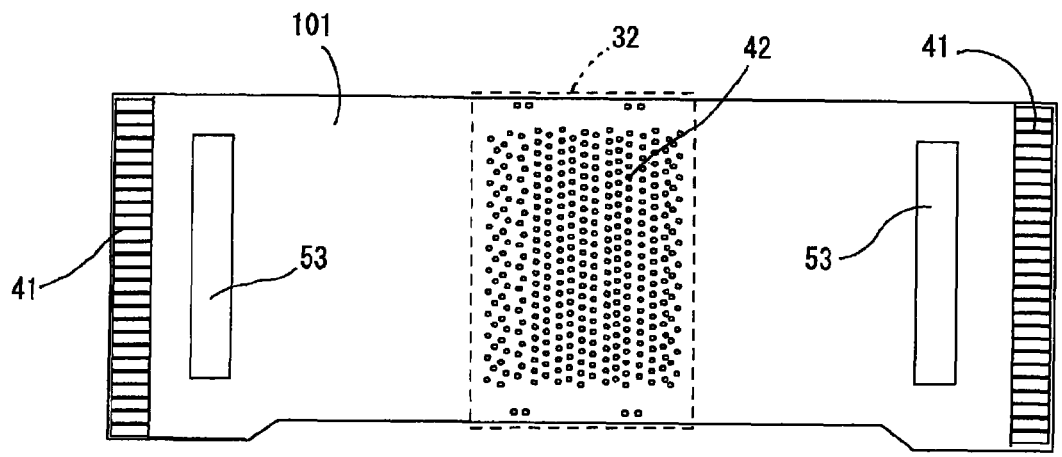

An embodiment will be described with reference to the drawings hereinafter.

FIG. 2 is a schematic plan view showing a recoding device 100 including a flexible wiring cable 1 of the embodiment on which a circuit element is mounted. This recording device 100 may be used in a single printer or may be used as a printer function (recording part) in a multifunctional device having a plurality of functions such as a facsimile function and a copy function.

As shown in FIG. 2, the recording device 100 includes a recording head 3 mounted on a carriage 2 and a platen 4 opposed to a lower surface of the recording head 3. A first guide member 5 and a second guide member 6 extend in a main scanning direction (Y-axis direction) of the carriage 2 and the carriage 2 reciprocates along them. The recording head 3 is mounted on the carriage 2 in such a manner that a nozzle 7 (refer to FIG. 5) is exposed so as to be opposed to the platen 4.

A sheet as a recording medium is transferred along a sub scanning direction (X-axis direction) perpendicular to the main scanning direction (Y-axis direction) of the carriage 2. The carriage 2 is moved reciprocally along the Y-axis direction by a timing belt 11 wound around a drive pulley 9 connected to a carriage (CR) motor 8 and a driven pulley 10.

As shown in FIG. 2, a housing part 14 for replaceable ink cartridges 13 is provided in a body frame 12 so that the ink cartridges 13 corresponding to ink colors (here, four cartridges for black ink, cyan ink, magenta ink, and yellow ink) are housed. The ink of each ink cartridge 13 is supplied to the carriage 2 through a flexible ink supply tube (resin tube) 15 independently.

Figure 3:
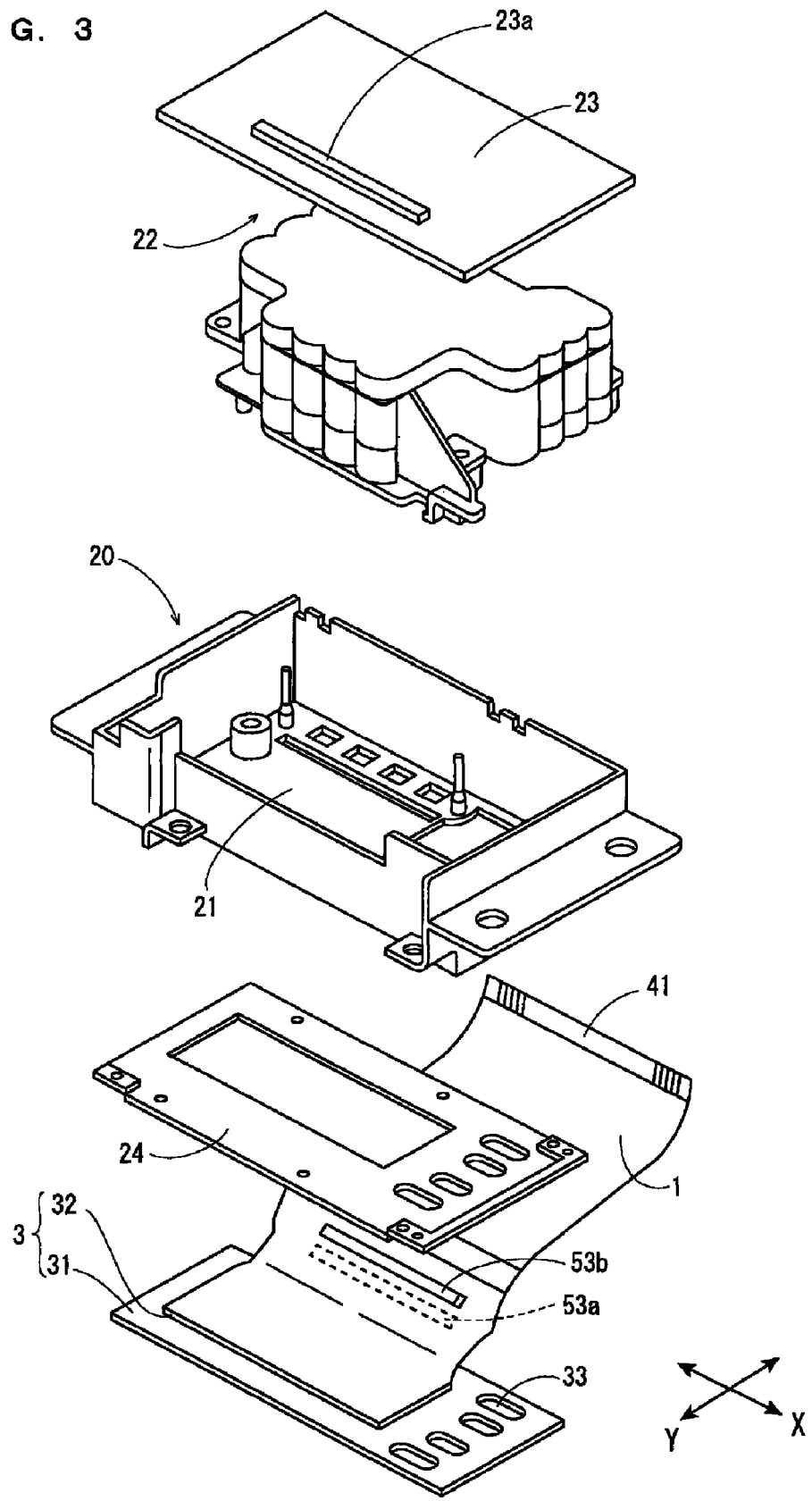
FIG. 3 is an exploded perspective view showing a carriage.

As shown in FIG. 3, the carriage 2 is provided with a roughly box-shaped head holder 20 having an opened upper surface, and the recording head 3 is fixed to a lower surface of a bottom plate 21 of the head holder 20 with a reinforcing frame 24 interposed. An ink storage part 22 in which ink supplied from the ink cartridge 13 is stored once, and a circuit substrate 23 are mounted on an upper surface side of the bottom plate 21 of the head holder 20. The circuit substrate 23 receives a drive signal from a control device (not shown) set in the body frame 12 through a flexible cable (not shown), and supplies the drive signal to an actuator 32 of the recording head 3 through the flexible wiring cable 1 connected to a connector 23a as will be described below.

As shown in FIGS. 3, 4, and 5, according to the recording head 3, similar to Japanese Patent Application Laid-Open No. 2005-322850, a cavity part 31 having an open nozzle 7 on its lower side and a pressure chamber 35 on its upper side, and the plate-shaped actuator 32 are laminated. The cavity part 31 is formed by laminating a plurality of thin plates, and an ink supply path 34 to distribute the ink supplied from the ink storage part 22 to an ink inlet 33 of the cavity part 31 to each of the plurality of pressure chambers 35 is provided in its inside (refer to FIG. 5). The actuator 32 includes a plurality of flat ceramics layers 36 having a size covering all the pressure chambers 35 and laminated in a direction perpendicular to its flat shape direction, and a plurality of electrodes arranged among the plurality of ceramics layers 36.

The electrode includes an individual electrode 37 provided for each pressure chamber 35, and a common electrode 38 provided for the plurality of pressure chambers 35, and they are arranged alternately in the ceramics layers 36. As shown in FIG. 4, the actuator 32 includes an individual surface electrode 39a electrically connecting all the individual electrodes 37 in the laminated direction and introducing it to the surface, and a common surface electrode 39b electrically connecting all the common electrodes 38 in the laminated direction and introducing it to the surface, on its uppermost surface. In addition, the surface electrodes are not shown in FIG. 5.

According to the actuator 32 provided with the electrodes as described above, when a high voltage is applied between the individual electrode 37 and the common electrode 38, a part of the ceramics layer 36 sandwiched between both electrodes is polarized and functions as an active part as known heretofore. In addition, at the time of recording, when a voltage lower than that at the time of polarizing is applied, the active part is elongated and a pressure is applied to the ink in the corresponding pressure chamber 35, so that the ink can be discharged from the nozzle 7.

According to the flexible wiring cable 1, an output terminal electrode 42 (refer to FIG. 6A) formed at a lower surface of its one end is electrically connected to the surface electrodes 39a and 39b formed on the upper surface of the actuator 32 and drawn out in the Y-axis direction long and its other end is connected to the circuit substrate 23. Thus, a circuit element 53a (first circuit element), and a circuit element (second circuit element) 53b are mounted on the flexible wiring cable 1. The circuit elements 53a and 53b convert the drive signal serially transferred from the circuit substrate 23 to a parallel drive signal corresponding to the plurality of individual surface electrodes 39a, and outputs it as a voltage suitable for driving the active part. This voltage is applied to the plurality of individual surface electrodes 39a and the common surface electrode 39b is connected to the ground potential.

Figure 6A:
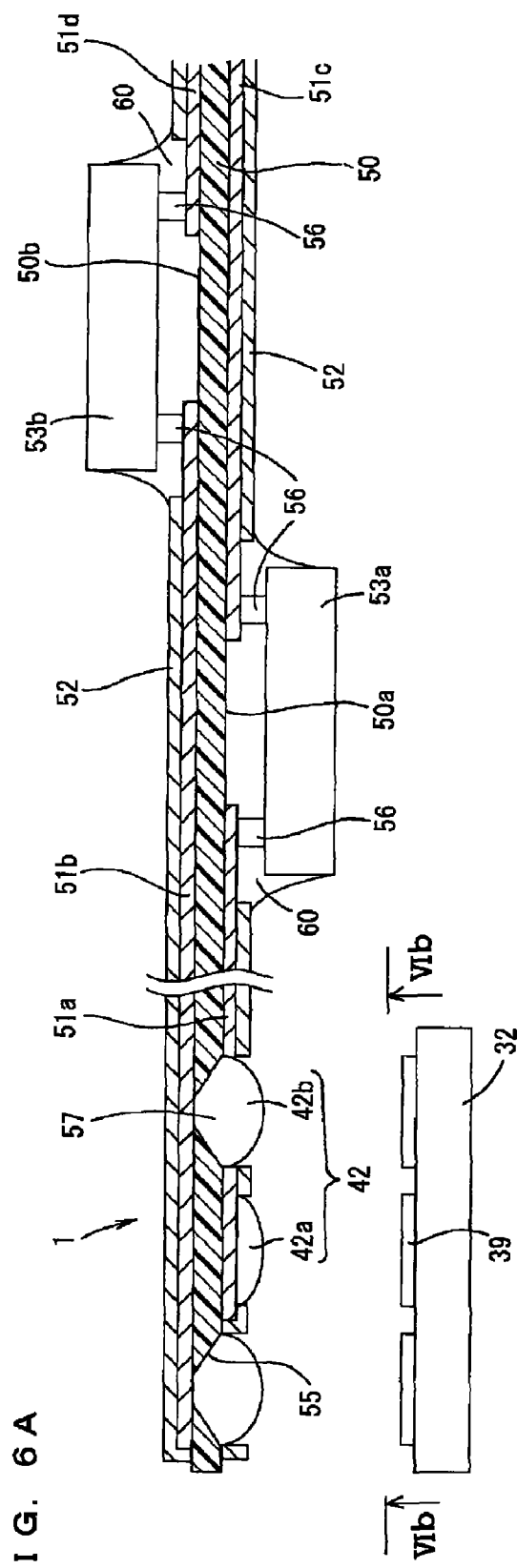
FIG. 6A is a schematic sectional view to explain an essential part of the flexible wiring cable.

As shown in FIG. 6A, the flexible wiring cable 1 includes a flexible flat insulating base (synthetic resin such as polyimide) 50, leads 51a, 51b, 51c, 51d, and 51e wired on both front and back surfaces of the base 50, and an insulation layer (resist and the like) 52 covering the leads. Thus, the circuit elements 53a and 53b are mounted on the leads on the front and back surfaces.

The leads include the input leads 51c and 51d for the circuit elements 53a and 53b, the output leads 51a and 51b from the circuit elements 53a and 53b, and the common lead 51e, on the front and back surfaces of the base 50. As shown in FIG. 4, the common lead 51e is wired along each side edge parallel to a drawing direction from the actuator 32, on the front and back surfaces of the base 50, and it is connected to the common surface electrode 39b of the actuator 32 and common terminals of the circuit elements 53a and 53b. A part in which the common lead 51e is connected to the common surface electrode 39b has almost the same constitution as that of the output terminal electrode 42 as will be described above, and the common lead 51e on a front surface 50b side includes a terminal electrode connected to the common surface electrode 39b by a conductive material such as a solder filled in a penetration part (through hole) of the base 50. The common lead 51e on a back surface 50a side includes a terminal electrode connected to the common surface electrode 39b by a conductive material such as a solder at a part exposed from the resist 52. The common lead 51e on the front surface 50b side and the common lead 51e on the back surface 50a side may not be electrically connected to each other.

The input leads 51c and 51d connect an input terminal electrode that can be connected to the connector 23a of the circuit substrate 23, to input terminals of the circuit elements 53a and 53b. Since the input leads 51c and 51d are provided on the front and back surfaces of the base 50, the input terminal electrodes 41 may be arranged on both front and back surfaces of the base 50, but the input terminal electrodes 41 may be arranged on one surface and one input lead may be connected to the input terminal electrode 41 through the base 50. The common lead 51e includes terminals to be connected to the connector 23a, at both ends of the input terminal electrode 41.

The output leads 51a and 51b connect the output terminals of the circuit elements 53a and 53b to the individual surface electrodes 39a of the actuator 32. The plurality of individual surface electrodes 39a are grouped and connected to the circuit element 53a or 53b. In this case, they may be grouped by column or by every other column or every couple of columns. For example, as will be described below, since the circuit elements 53a and 53b do not overlap in plan view, the columns of the individual surface electrodes 39a may be divided into two groups in the same direction of the arranged direction of the circuit elements 53a and 53b so as to reduce the difference of the lengths between the output leads 51a and 51b.

The circuit elements 53a and 53b are mounted on the front and back surfaces of the base 50 over the input leads 51c and 51d, the output leads 51a and 51b and the common lead 51e. Hereinafter, a description will be made of the circuit element 53a in detail. That is, the insulation layer 52 is removed from the mounting region and ends of the input lead 51c, the output lead 51a and the common lead 51e are exposed. In the circuit element 53a, a bump 56 is formed at each of the input, output and common terminals. The bump 56 is plated with gold (Au) and an exposed parts of the leads 51a, 51c and 51e are plated with tin (Sn), so that when the circuit element 53 and the flexible wiring cable 1 are heated and pressurized, eutectic bonding is provided between gold (Au) and tin (Sn), so that they are strongly connected. After connection, the bump 56 of the circuit element 53 and the exposed parts of the leads 51a, 51c and 51e are covered with a resin 60 to be insulated.

The other circuit element 53b is mounted at a region not overlapping with the circuit element 53a in a plan view. More specifically, the output lead 51b is elongated from the actuator 32 to a position farther than the circuit element 53a in the drawing direction of the base 50 from the actuator 32, and the input lead 51d is set shorter than the distance between the input terminal electrode 41 and the circuit element 53a. A connection structure of the circuit element 53b to the input lead 51d, the output lead 51b and the common lead 51e is the same as above.

Figure 7:
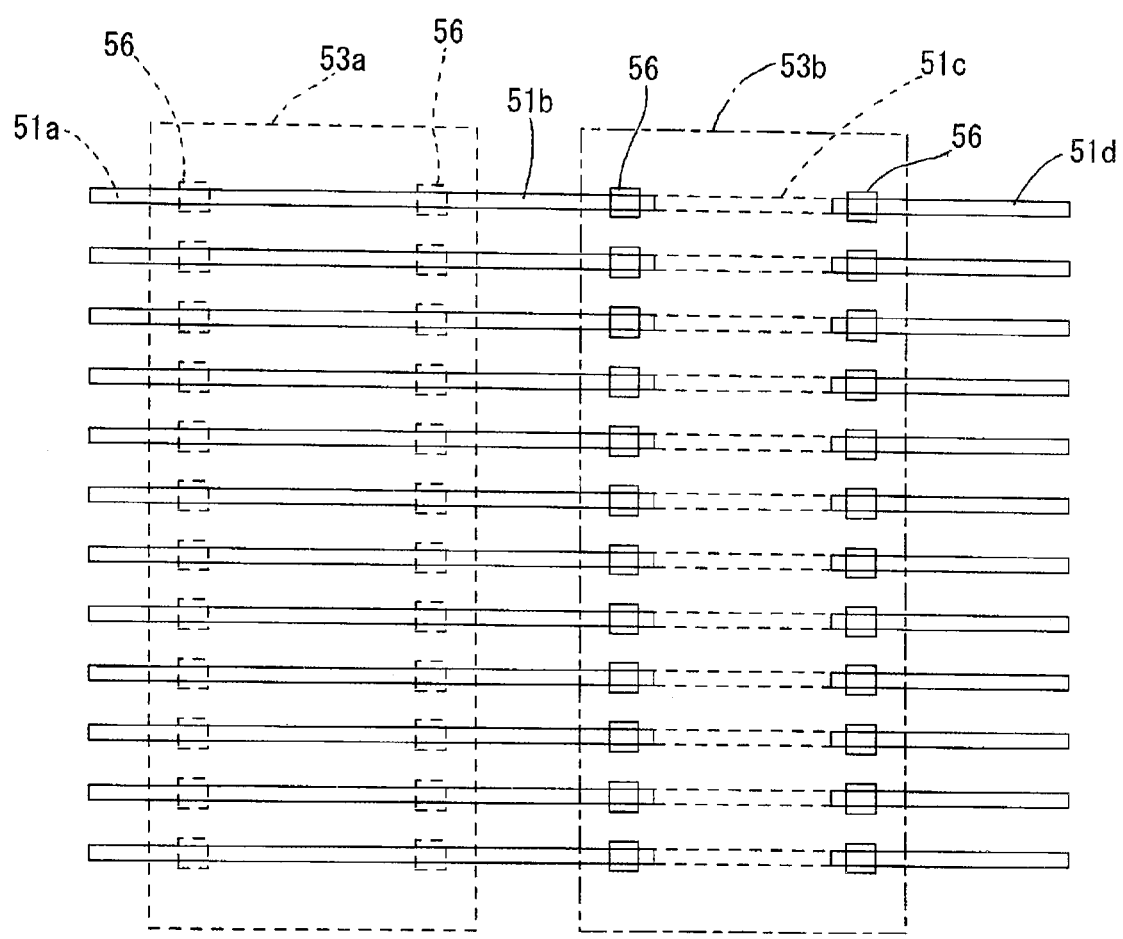
FIG. 7 is a plan view to explain arrangement of circuit elements on front and back surfaces.

As shown in FIG. 7, the output lead 51a and the input lead 51c on the side of the back surface 50a, and the output lead 51b and the input lead 51d on the side of the front surface 50b are arranged at the positions overlapping in plan view. Since the circuit elements 53a and 53b do not overlap in the mounted region as described above, the bump 56 of one circuit element 53a (or 53b) overlaps with the lead on the other surface, and does not overlap with the bump 56 of the other circuit element 53b (or 53a). Thus, since wiring is performed on the surface having the bump 56 and its opposite surface so that the thickness of the flexible wiring cable 1 having the bump 56 can be equal, the pressure can be applied uniformly to all the bumps 56 when the circuit elements 53a and 53b are connected to the leads.

As a matter of course, a part having no lead 51 (a part of the base 50 covered with the insulation layer 52 directly) may be positioned on the opposite surface of the surface having the bump 56. However, since a wiring pitch of the lead is fine in practice (a wiring pitch is largely illustrated schematically in FIGS. 6B and 7), a space between the adjacent leads is considerably narrow. Therefore, in order to make uniform the thickness of the flexible wiring cable 1, it is preferable that the lead is provided on the opposite surface of the surface having the bump 56 as described above.

The output terminal electrode 42 includes a first terminal electrode 42a for the lead 51a on the back surface 50a and a second terminal electrode 42b for the lead 51b of the front surface 50b. The first terminal electrode 42a is formed by removing the insulation layer 52 on the back surface 50a to partially expose the lead 51a and attaching a conductive brazing filler metal at that part so as to be projected. The second terminal electrode 42b is formed by supplying a conductive brazing filler metal 57 to a penetration part 55 (through hole) penetrating the front and back surfaces of the base 50 and connecting the conductive brazing filler metal 57 to the lead 51b on the front surface 50b and projecting it to the side of the back surface 50a.

The penetration part 55 is formed so as to be tapered such that the back surface 50a larger than the front surface 50b of the base 50. The tapered shape of the penetration part 55 is formed by performing wet etching on the base 50 from the side of the back surface 50a. Thus, when the brazing filler metal 57, a solder, for example is injected from the side of the back surface 50a, the solder 57 is supplied in the penetration part 55 and reach the lead 51b on the front surface side, so that the second terminal electrode 42b can be easily formed by supplying the solder 57 only.

Figure 8:
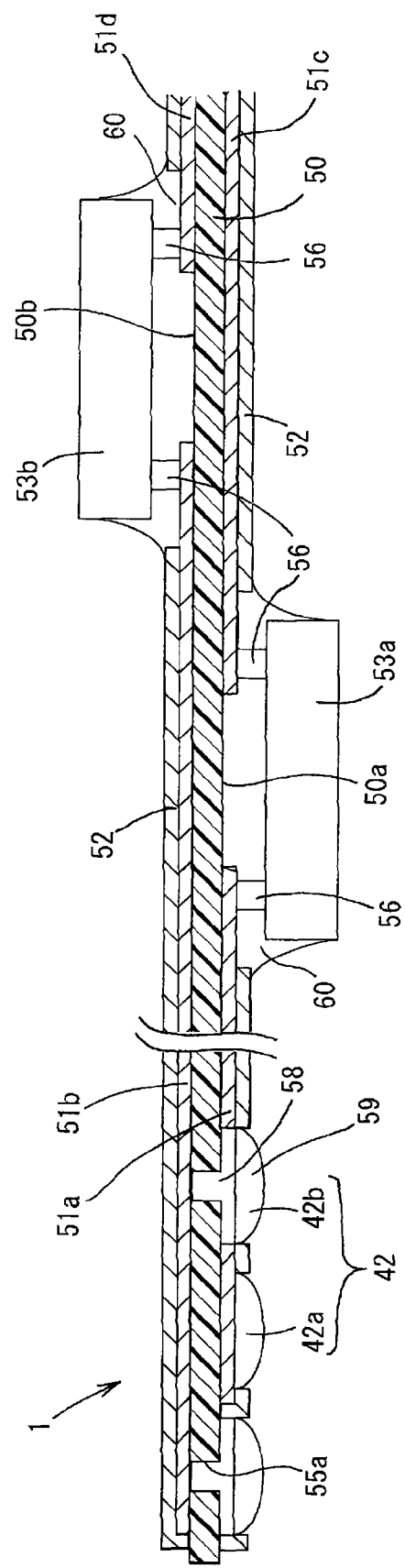
FIG. 8 is a schematic sectional view to explain another method of forming a second terminal electrode.

As another forming method of the penetration part, a method using a penetration part 55a provided in the base 50 by laser process or punching process may be used (refer to FIG. 8). In addition, the second terminal electrode 42b can be also formed by plating the penetration part 55a, forming a conductive part 58 continued to the lead 51b on the front surface side, and attaching a solder 59 on it so as to be projected.

Figure 6B:
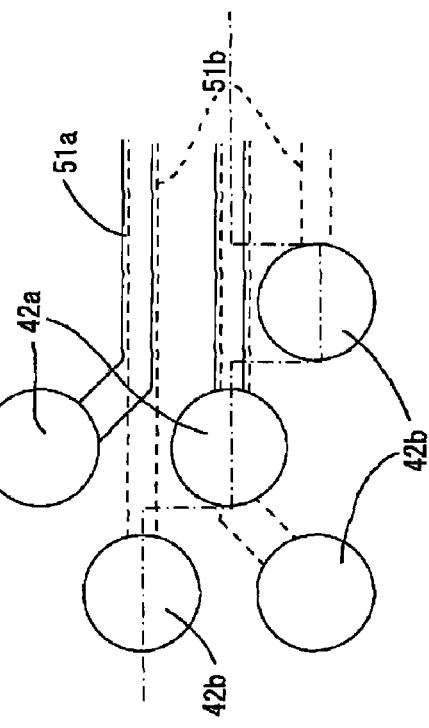
FIG. 6B is a fragmentary view taken in the direction of the arrows along VIb-VIb of FIG. 6A.

The first terminal electrode 42a and the second terminal electrode 42b are formed so as to be projected at the same height on the side of the back surface 50a. In addition, as shown in FIG. 6B, even at the position in which the output leads 51a and 51b overlap, the first terminal electrode 42a and the second terminal electrode 42b are arranged so as not to overlap and to correspond to the individual surface electrodes 39a, respectively by elongating the lead on the side of the front surface 50b. Each of the first terminal electrode 42a and the second electrode 42b overlap the corresponding individual surface electrode 39a and the terminal electrode of the common lead 51d overlaps with the common surface electrode 39b and when they are heated and pressurized, they are electrically and mechanically connected by solder bonding.

Thus, according to this embodiment, since the leads and the circuit elements are arranged on the front and back surfaces of the flexible wiring cable 1 and the front and back surfaces are used, a substantial wiring area can be doubled without increasing the size of the flexible wiring cable 1 as compared with the case they are arranged on one surface only. In addition, since the circuit elements 53a and 53b mounted on the front and back surfaces are positioned so as not to overlap in a plan view, they can be mounted without interfering with each other. Furthermore, even when the front and back surfaces of the flexible wiring cable 1 are used, since the output terminal electrode 42 is concentrated on one surface of the flexible wiring cable 1, it can be easily connected to the surface electrode of the actuator 32.

Though the structure of the present invention is applied to the output terminal electrode in the above-described embodiment, the present invention is not limited to this embodiment, the structure can be similarly applied to the input terminal electrode in place of the output terminal electrode. Also, the structure of the present invention can be applied to both the output terminal electrode and the input terminal electrode.

It is supposed in the above-described embodiment that the number of leads on the front surface of the base and that of leads on the back surface thereof are the same. But in the case where the numbers are different, dummy leads may be provided on the surface having less leads. When these dummy leads are provided corresponding to the positions where at least bumps are formed on the opposite surface, the thickness of the flexible wiring cable is uniform and the connection defect of bump can be prevented.

In addition, the connection between the bump 56 of the circuit element 53 and the lead 51, and the connection between the output terminal electrode 42 and the surface electrode may use gold (Au)-gold (Au) bonding, ACF (Anisotropic Conductive Film), ACP (Anisotropic Conductive Paste), NCF (Non-Conductive Film), NCP (Non-Conductive Paste) and the like.

In addition, the flexible wiring cable on which the circuit element is mounted can be applied not only the recording head 3 of the recording device 100 as described above but also another device such as a liquid crystal display device and a sensor device such as CCD or the like.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A flexible wiring cable, comprising:
   a flexible flat base;
   first leads comprising a plurality of first input leads, a plurality of first output leads, and a first common lead, wired on a first surface of the base;
   second leads comprising a plurality of second input leads, a plurality of second output leads, and a second common lead, wired on a second surface which is the other side of the base;
   a first circuit element mounted on the first leads on the first surface, the first circuit element comprising a plurality of first terminals corresponding, respectively, to the plurality of first input leads, to the plurality of first output leads, and to the first common lead;
   a second circuit element mounted on the second leads on the second surface, the second circuit element comprising a plurality of second terminals corresponding, respectively, to the plurality of second input leads, to the plurality of second output leads, and to the second common lead; and
   a plurality of output terminal electrodes provided on the first surface of the base;
   wherein the plurality of output terminal electrodes comprise a plurality of first terminal electrodes formed on and electrically connected to the first circuit element through the first output leads, and a plurality of second terminal electrodes formed on and electrically connected to the second circuit element through the second output leads, being exposed to the first surface via through holes formed in the base.

2. The flexible wiring cable according to claim 1, wherein the first circuit element and the second circuit element are arranged on the base so as not to overlap with each other in plan view.

3. The flexible wiring cable according to claim 1, wherein in regions mounted with the first and second circuit elements in the base, the first and second leads are partially exposed to the outside, bumps made of conductive material are arranged on them, and the first and second circuit elements are connected to the first and second leads respectively through the bumps, and
   the first and second leads are wired on the base so that a thickness of the flexible wiring cable at the positions arranged with the bumps is uniform.

4. The flexible wiring cable according to claim 3, wherein a part having no bump on the first and second leads is wired at an opposite position of the base having the bumps.

5. The flexible wiring cable according to claim 1, wherein the through hole is tapered in such a manner that an opening on the first surface side of the base is larger than an opening on the second surface side thereof, and
   the second terminal electrodes are formed by conductive material supplied to the through holes so that one end is connected to the second leads on the second surface and the other end is exposed to the first surface.

6. The flexible wiring cable according to claim 1, wherein the first and second terminal electrodes are connected to an actuator of a recording head performing a recording operation by selective drive of the actuator.

* * * * *